United States Patent [19]

Wyman

[11] Patent Number: 4,982,169
[45] Date of Patent: Jan. 1, 1991

[54] MONOLITHICALLY INTEGRATED RC OSCILLATOR OF IMPROVED STABILITY

[75] Inventor: Theodore J. Wyman, Baldwinsville, N.Y.

[73] Assignee: General Electric Company, Syracuse, N.Y.

[21] Appl. No.: 899,734

[22] Filed: Aug. 25, 1986

[51] Int. Cl.⁵ ............................................. H03K 3/26
[52] U.S. Cl. ..................................................... 331/111
[58] Field of Search .................. 331/111, 108 D, 109, 331/113 R, 176

[56] References Cited

U.S. PATENT DOCUMENTS

| | | | |
|---|---|---|---|
| 2,892,035 | 6/1959 | Trousdale . | |
| 3,461,404 | 8/1969 | Kutschbach | 307/218 |
| 3,688,220 | 8/1972 | Gay | 331/111 |
| 3,725,822 | 4/1973 | Eaton, Jr. | 331/108 B |
| 3,921,101 | 11/1975 | McCoy et al. | 331/108 D |
| 4,115,748 | 9/1978 | Kubo et al. | 331/111 |
| 4,122,413 | 10/1978 | Chen | 331/108 D |
| 4,298,926 | 11/1981 | Black | 363/132 |
| 4,301,427 | 11/1981 | Suzuki et al. | 331/111 |
| 4,413,238 | 11/1983 | Pace | 331/111 |
| 4,535,305 | 8/1985 | Matsuo | 331/111 |
| 4,594,565 | 6/1986 | Barreras | 331/111 |

Primary Examiner—Theodore M. Blum
Attorney, Agent, or Firm—Richard V. Lang; Paul Checkovich; Fred Jacob

[57] ABSTRACT

The invention relates to a monolithically integrated RC oscillator in which the frequency is of reduced dependency upon process variations, supply voltage variations or temperature. The circuit employs two RC circuits, typically not integrated, each capacitor of which is alternately charged via a transistor switch to the supply potential. The discharge of each capacitor takes place through the shunting resistance to a potential set by the switching voltages of two buffer amplifiers in the forward gain path of the oscillator. If the switching voltages are set midway between the supply voltages, and identical buffer amplifiers are employed, the temperature, voltage and other process variables tend to produce compensatory changes in frequency. The circuit is also optimized to minimize transient delays and thereby further decrease the dependence of oscillator frequency upon voltage, temperature, or process variations affecting the integrated active circuitry. The circuit is carried out in the (CMOS) process.

14 Claims, 3 Drawing Sheets

MONOLITHICALLY INTEGRATED RC OSCILLATOR OF IMPROVED STABILITY

The Government has rights in this invention pursuant to Contract No. F30602-83-C-0058, awarded by the Rome Air Development Center, Department of the Air Force.

BACKGROUND OF THE INVENTION

The invention relates to RC oscillators and more particularly to an RC oscillator in which the active elements are monolithically integrated and in which the frequency is stabilized against temperature, supply voltage or process variations.

DESCRIPTION OF THE PRIOR ART

RC oscillators as a class are well known. Typically, the oscillators employ a resistance/capacitance shunt circuit to set the operating frequency. In a known RC network, as for instance that shown in FIG. 4, an active transistor driver is used in the path by which the capacitors of the RC networks are charged and discharged.

In this known design, the transistor drivers become a part of the frequency determining network and changes in the driver impedance change the effective RC time constant and thereby the operating frequency of the oscillator. In the illustrated circuit, for instance, the capacitor is charged via the impedance of the output stage and discharged via the resistance R1 and the output impedance of the input stage.

When the resistance and capacitance values of the RC circuit elements become small at higher frequencies in RC oscillators, the stability of the oscillator frequency with temperature and supply voltage variation depends significantly upon the impedance of the transistor drivers. At these high frequencies, the small resistances and capacitances become comparable to the transistor driver impedance and to the parasitic capacitances of the active elements. As a result, in the conventional RC oscillator design, the oscillator frequency will be significantly affected by variations in the process by which the active elements are fabricated, by the temperature which may vary over wide limits (e.g. $-55°$ to $+125°$), or by variations in the power supply voltage.

SUMMARY OF THE INVENTION

Accordingly, it is an object of the invention to provide an improved RC oscillator suited to monolithically integrated fabrication.

It is another object of the invention to provide an oscillator suited to monolithically integrated fabrication in which the frequency is of improved stability in relation to process variations or variations in temperature or supply voltage.

It is a further object of the invention to provide an RC oscillator in which the active circuitry is monolithically integrated, and in which the oscillator frequency is largely unaffected by variation in impedance of the transistor drivers.

It is still another object of the invention to provide an RC oscillator of improved stability in which the active circuitry is monolithically integrated using a complementary metal oxide semiconductor (CMOS) process.

These and other objects of the invention are achieved in a novel RC oscillator comprising a substrate upon which the active elements may be monolithically integrated, having a first terminal for connection to a source of drain potentials (VDD) and a second terminal for connection to a source of source potentials (VSS).

The RC oscillator comprises two RC circuits normally discrete circuit elements, not monolithically integrated. The first RC circuit has one terminal coupled to the first substrate terminal and the other terminal to a first node (C), and the second RC circuit has one terminal coupled to the second substrate terminal and the other terminal coupled to a second node (A).

The active circuitry, which is monolithically integrated on the substrate, includes a P type and an N type transistor switch. The P type transistor switch has a source, a drain, and a gate electrode, the source electrode being coupled to the first substrate terminal (VDD), and the drain electrode being coupled to the node A. The P type transistor switch periodically connects the second RC circuit to source and drain potentials and charges the capacitor to their potential difference.

The N type transistor switch has a source, a drain, and a gate electrode, the source electrode being coupled to the second substrate terminal (VSS), and the drain electrode being coupled to node C. The N type transistor switch periodically connects the first RC circuit to source and drain potentials and charges the capacitor to their potential difference.

The active circuitry further includes a pair of buffer amplifiers each designed to switch to a logical high or a logical low output state when the input voltage crosses a switching voltage, which is set approximately midway between source and drain potentials. The first buffer amplifier has its input coupled to the node (C) and the second buffer amplifier has its input coupled to node (A) for response to the voltages on the two RC circuits.

The oscillator is completed by means responsive to the outputs of the first and second amplifiers to cause one switch to be on during the period that the other switch is off. The capacitors of the RD circuits are charged alternately by these means so that the turn off of one switch, as the voltage on the first RC circuit crosses the switching voltage of the first amplifier (as a result of the first capacitor discharging through said first resistor), initiates the discharge of the second capacitor through the second resistor. This latter discharge proceeds until the switching voltage of the second amplifier is crossed, turning off the other switch and initiating the discharge of the first capacitor through the first resistor, and a repeat of the sequence.

By these means the oscillator frequency is primarily determined by the sum of the durations of the two resistor controlled capacitor discharges, each of which take place while the associated transistor switch is off.

In accordance with another aspect of the invention, the two buffer amplifiers are of like design so that the effect of any processing error or temperature variation upon the switching voltage, will elevate or depress both switching voltages together and cause offsetting changes in oscillator period.

In the preferred embodiment an output stage is provided, coupled to the output of the buffer amplifiers, and a pair of feedback amplifiers are also provided each coupled between the output of the output stage and the input of one transistor switch. Preferably each feedback amplifier is optimized for rapid turn off of the associated transistor switch to reduce the interval in the total oscillator period that is dependent on active device parameters. This feature further reduces the effect of process variation or temperature on oscillator frequency.

The design is advantageously carried out using a complementary metal oxide semiconductor CMOS field effect transistor (FET) process.

BRIEF DESCRIPTION OF THE DRAWINGS

The inventive and distinctive features of the invention are set forth in the claims of the present application. The invention itself, however, together with further objects and advantages thereof, may best be understood by reference to the following description and accompanying drawings in which:

DESCRIPTION OF THE PREFERRED EMBODIMENT

Figure 1:
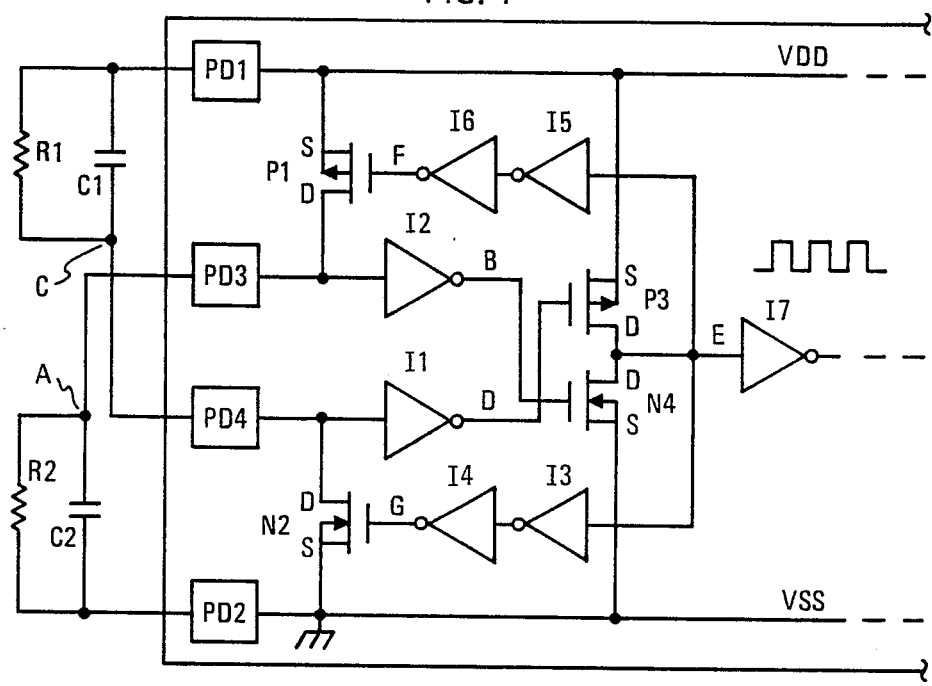
FIG. 1 is a circuit diagram of an RC oscillator of improved frequency stability representing a first embodiment of the invention, the oscillator combining two RC circuits with monolithically integrated active elements.

Referring now to FIG. 1, there is shown a novel RC oscillator suited to integrated circuit fabrication as a first embodiment of the invention. The novel oscillator, which is designed for operation in the low to mid megahertz frequency range, is of enhanced stability, the output frequency being substantially independent of variations in temperature, power supply voltage, and process parameters.

The oscillator includes two passive RC shunt circuits typically external to the integrated circuit, which are the primary frequency setting circuit elements, and active circuitry, fabricated on the integrated circuit, consisting of a P-FET switch P1, an N-FET switch N2 instrumental in charging the RC circuits, two inverting forward buffer amplifiers (I1,I2), a CMOS output stage (P3,N4), and two non-inverting feedback buffer amplifiers (I3,I4, and I5,I6). The oscillator is then coupled through a buffer amplifier I7 to the additional circuitry on the integrated circuit. As will be explained, the novel circuit configuration enhances oscillator stability.

Bias connections to the integrated circuit are conventional for CMOS circuitry. The connections are provided at pads Pd2 and Pd3, the drain supply VDD being coupled to pad Pd2, and the source supply VSS being coupled to pad Pd3. VDD and VSS are internally available on the chip from buses as illustrated. With an integrated circuit having an N type substrate and using CMOS (Complimentary Metal Oxide Semiconductor) FET (Field Effect Transistor) devices, the VDD voltage may typically be from 3 to 15 volts, depending on the voltage rating of the process, and the VSS voltage should be 0 volts with respect to ground. The N type substrate is at the VDD potential as a result of numerous internal connections to the VDD bus.

In describing the states of a CMOS stage, each of which consists of a P type device in series with an N type device, the output in the normal conditions of drive assumes either a value substantially equal to VDD or a value substantially equal to VSS. For the purposes of further description, a VDD output level will be referred to as the logic "1" state and a VSS output level will be referred to as the logic "0" state.

The first RC circuit consists of a capacitor C1 and a resistor R1 connected in shunt. The circuit R1C1 shown to the left in the drawing is external to the integrated circuit substrate shown to the right, whose boundaries are as indicated by the solid line. The IC substrate or "chip" has additional circuitry extending off to the right as indicated by the break in the substrate and the dashed trailing lines of the VDD and VSS buses and the I7 output. One terminal of the circuit R1C1 is coupled to the pad Pd1 leading to the VDD bus and the other terminal is coupled to the pad Pd3 at the node denoted "C".

The second RC circuit consists of a capacitor C2 and a resistor R2 connected in shunt and disposed external to the chip. One terminal of the circuit R2C2 is coupled to the pad Pd2 leading to the VSS bus, and the other terminal is coupled to the pad Pd3 at the node denoted A. As will be seen, the two RC networks are alternately charged and discharged as a result of alternating conditions of the N-FET switch N2 and P-FET switch P1. When the time constant of the circuit R1C1 equals the time constant of the circuit R2C2, the oscillator output will have a 50% duty cycle subject to error attributable to other variables. The duty cycle may be easily varied by adjusting the ratio of R1C1 to R2C2 without penalty as to frequency stability.

The switches N2 and P1 are a part of the active circuitry which is fabricated on the chip. The P-FET switch P1 has its source coupled to the internal VDD bus and its drain coupled via pad Pd1 to the circuit R2C2 at node A. The N-FET switch N2 has its source coupled to the internal VSS bus and its drain coupled via pad Pd4 to the circuit R1C1 at node C. The gates of switches P1 and N2, are connected to provide alternate conduction achieved via a feedback network yet to be described. The switches are large geometry devices in relation to the other active devices.

The remainder of the active oscillator circuitry controls the operation of the switches P1 and N2. In the forward gain paths, two inverting buffer amplifiers I1 and I2 are provided responding to the states of the RC circuits R1C1 and R2C2, and establishing the state of the CMOS output stage P3, N4. The input of the first inverting buffer amplifier I1 is coupled to pad Pd3 at node C and the output of the first amplifier I1 is coupled to the gate of the P type output device P3 at node D. The input of the second inverting buffer amplifier I2 is coupled to pad Pd3 at node A and the output of the second amplifier I2 is coupled to the gate of the N type output device N4 at node B.

The amplifiers I1 and I2, which are represented by a logical symbol denoting an inverting amplifier, are implemented in the conventional CMOS process by a single stage consisting of a P type device connected in series with an N type device as suggested earlier. The devices of I1 and I2 have insulated gates at their connections to the nodes C and A. Accordingly, the input impedances of I1 and I2 tend to be very high relative to the values of the resistances and capacitances making up the RC circuits R1C1 and R2C2. The input resistance of I1 and I2 is several orders of magnitude higher than the several K ohm values of the resistances in the RC circuits. The input resistances of I1 and I2 thus have a negligible effect upon the rate at which the RC circuits charge and discharge. However, the input capacitances of I1 and I2 and other stray capacitances at the nodes A and C are significant. They are typically on the order of a pico-farad and thus several percent of the 10-20 pico-farad values of the capacitances in the RC circuit. The values of the "stray capacitances" are not temperature dependent but are process dependent, and provide justification when very close tolerances are sought, for placing the resistance or the capacitance of the RC circuits off the chip.

The two amplifiers I1 and I2 are physically matched by like geometry to produce switching voltages that are as close together as possible. The inverter switching voltage is set at a level midway between VSS and VDD, and as earlier noted, the output tends to assume a zero or a "1" logical output state. The output of the amplifiers I1 and I2 are coupled to the gates of the devices P3 and N4 at the oscillator output.

The CMOS output stage of the oscillator consists of one P type device P3 and one N type device N4. The source of the device P3 is coupled to the VDD bus, the drain to the node E, at which the oscillator output appears, and the gate, as already noted, to the node D at the output of the first inverter I1. The source of the device N4 is coupled to the VSS bus, the drain to the node E, and the gate, as already noted, to the node B at the output of the second inverter I2. The drains of the device P3 and the device N4 are thus coupled together at the node E and serve as the point for derivation of the oscillator output ($V_{OUT}$).

The oscillator output is taken via the output buffer I7. The output, taken either at the input or output of the buffer I7 is essentially a rectangular waveform, having a substantially 50% duty cycle and having an amplitude alternating between VDD and VSS. The frequency, which may lie in the range of 1–50 megaherz, with the upper limit expected to increase as the technology advances, is of enhanced stability against process and temperature variations.

Figure 3A:
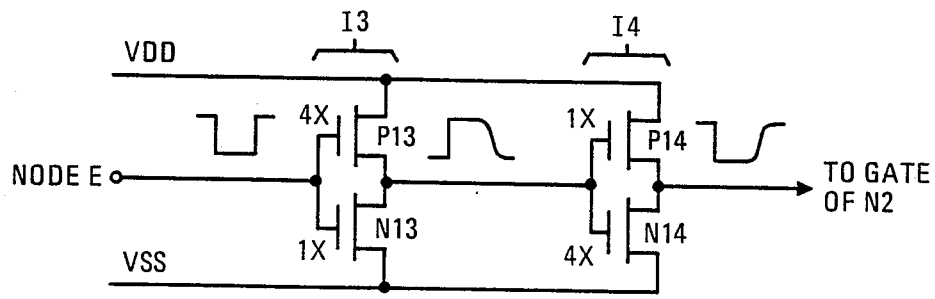
FIGS. 3A and 3B illustrate the circuits of two non-inverting buffer amplifiers employed in the feedback paths of the RC oscillator of the first embodiment and optimized to enhance oscillator frequency stability.
Figure 3B:
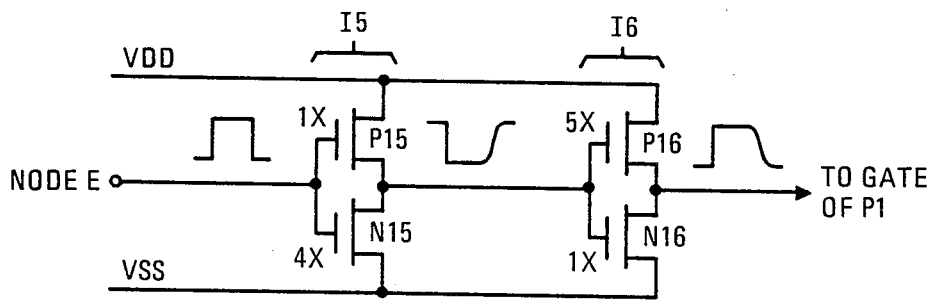

The active oscillator circuitry is completed by the non-inverting buffer amplifiers I3, I4 and I5, I6 connected in a feedback path between the oscillator output node E and the gates to the transistor switches P1 and N2. The forward and feedback connections are sensed to cause alternating conduction of the transistor switches P1 and N2. More particularly, the non-inverting feedback buffer amplifiers I3, I4 and I5, I6 have their inputs coupled to the node E at the oscillator output, and their outputs coupled respectively to the gates of the transistor switch N2, and of the transistor switch P1. The circuitry of the feedback amplifiers is shown in FIGS. 3A and 3B, in a design which enhances oscillator stability by effecting a rapid turn off of the switch to which each feedback amplifier is connected.

The oscillatory sequence, described with reference to FIG. 1, which shows the relevant nodes A through G, and FIG. 5, which shows the waveforms at the nodes A, C and E, follows.

In an assumed initial oscillatory state taken at time $T_o$, the oscillator output at node E is low, output device P3 and output device N4 being off, with the node D being high and node B being low and the low state at node E being sustained by the parasitic capacity at node E. Nodes F and G connected through non-inverting amplifiers I5, I6 and I3, I4 to node E are low. Here the lows correspond to the logic "zero" state and the highs to the logic "1" state. The switch P1 will be on and switch N2 will be off. The time, "$T_o$" is taken at an instant before the output at node E, supported by changed internal states, switches to a logic "1" state.

The conditions of the R1C1 and R2C2 circuits at the time $T_o$ are as follows. At $T_o$, switch N2 is still off and the voltage on capacitor C1 (node C) of the circuit R1C1 will be near the switching point of amplifier I1, half way between VDD and VSS and still climbing as C1 discharges through R1. Similarly at $T_o$ switch P1 is still on and the voltage on capacitor C2 (node A) of the circuit R2C2 will be near VDD and substantially steady, the capacitor having charged through the low impedance of switch P1.

The initial state at $T_o$ in which the oscillator output at node E is a logical "0" now progresses toward a second state at $T_1$, in which the oscillator output is a logical "1". Shortly after $T_o$, amplifier I1 switches, propagating a state change through the logic, turning on P3, and after a short delay turning off P1 and after a longer delay turning on switch N2. As will be seen, the shorter delay is minimized to enhance oscillator stability, and the longer delay is tolerated, since it does not significantly affect oscillator timing.

The operation after $T_o$ at node C will be treated before the operation at node A. At node C after $T_o$, conduction of switch N2, causes the voltage on node C (previously near the switching point of amplifier I2), to fall sharply toward VSS as capacitor C1 charges through the low impedance of switch N2. When the switching point of amplifier I1 is again crossed, the output at node D goes high shutting off device P3. After this point, the oscillator output at node E, with both output devices P3 and N4 off, is not connected to either voltage supply, but the parasitic capacity present at the node E holds the output state to VDD, a logical "1".

At node A after $T_o$, the switching off of P1, in response to the switching of amplifier I1 preceeds the turn on of N2 just described. After $T_o$, switch P1, which was previously on, holding the voltage at node A to near VDD, turns off. The voltage at node A will now fall as capacitor C2 discharges through R2 toward VSS and the second state is reached, continuing until time $T_1$.

In the second oscillatory state taken at time $T_1$, the oscillator output at node E is high, output device P3 and output device N4 being off, with the node D being low and node B being high and the high state at node E being sustained by the parasitic capacity at node E. Nodes F and G connected through non-inverting amplifiers I5, I6 and I3, I4 to node E are high. The time $T_1$ (as with $T_o$) is taken at the instant before the output at node E, supported by changed internal states, switches to VSS, a logic "0" state.

The conditions of the R1C1 and R2C2 circuits at the time $T_1$ are as follows. At $T_1$, switch P1 is still off and the voltage on capacitor C2 (node A) of the circuit R2C2 will be near the switching point of amplifier I2, half way between VDD and VSS and still falling as C2 discharges through R2. Similarly, at $T_1$, switch N2 is still on and the voltage on capacitor C1 (node C) of the circuit R1C1 will be near VSS and substantially steady, the capacitor having charged through the low impedance of switch N2.

The second state at $T_1$, in which the oscillator output at node E is a logical "1", now progresses toward a return to the initial state at $T_2$ in which the oscillator output is a logical "0". Shortly after $T_1$, amplifier I2 switches, propagating a state change through the logic turning on switch N4, and after a short delay turning off amplifier I1 and after a longer delay turning on switch P1. As will be seen, the shorter delay is minimized to enhance oscillator stability and the longer delay is tolerated, since it does not significantly affect oscillator timing.

The operation after $T_1$ at node A will be treated before operation at node C. At node A, after $T_1$, conduction of switch P1, causes the voltage on node A (previously near the switching point of amplifier I2) to rise rapidly toward VDD as capacitor C2 charges through the low impedances of switch P1. When the switching point is again crossed, the output at node B goes low switching off device N4. After this point, the oscillator output at node E, with both devices P3 and N4 off, is not connected to either voltage supply, but the parasitic capacity present at the node E holds the output state to VSS, a logical "0".

At node C, after $T_1$, the switching off of N2, in response to the switching off of amplifier I2 preceeds the turn on of P1 just described. After $T_1$, switch N2, which was previously on, holding the voltage at node C to near VSS, turns off. The voltage at node C will rise as capacitor C1 discharges through R1 toward VDD, and a repeat of the initial state is reached, continuing until time $T_2$.

Summarizing the voltage on the circuit R1C1 (node C) is an approximate sawtooth waveform, which rises slowly from VSS to a point just past the switching point of amplifier I1, a voltage half way between VDD and VSS, and then falls steeply to VSS. Similarly, the voltage on the circuit R2C2 (node A) is an approximate sawtooth waveform which falls slowly from VDD to a point just past the switching point of amplifier I2, a voltage half way between VDD and VSS, and then rises steeply to VDD.

Figure 5:
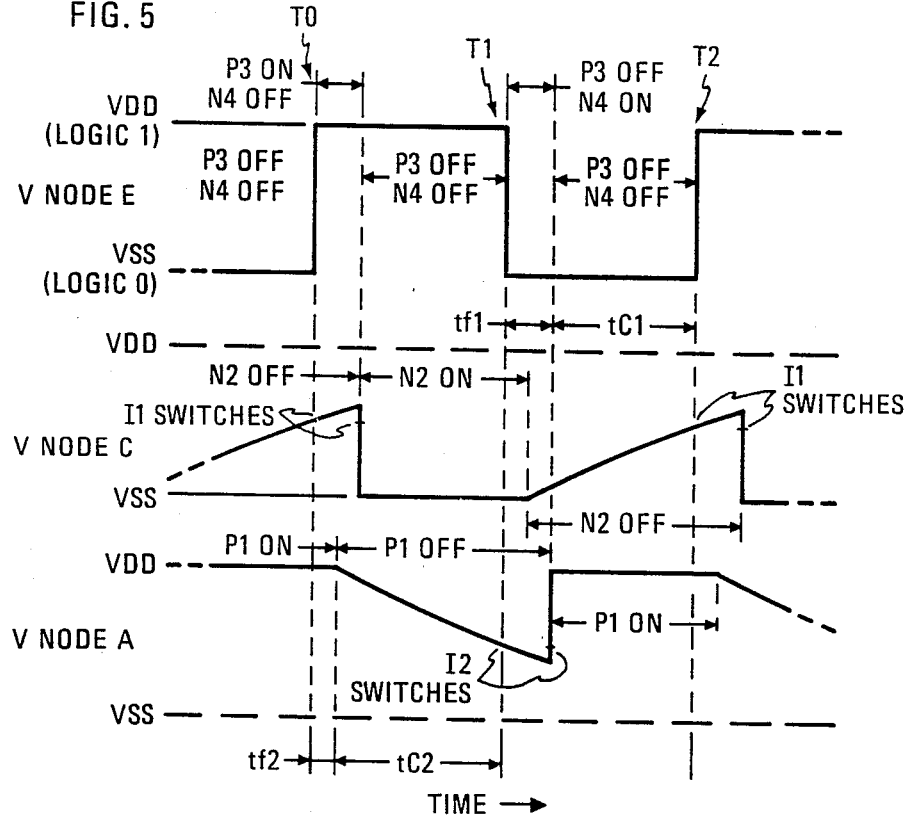
FIG. 5 illustrates the time dependent waveforms appearing at the oscillator output and at nodes associated with the two RC circuits of the two embodiments.

As suggested in FIG. 5, the duration of each half cycle of operation of the RC oscillator is dependent on the delay (tf1 or tf2) required for the switch P1 or N2 to turn off to start each sloped waveform portion, and the duration of each sloped waveform portion (tC1 or tC2), commencing at one bus (VDD or VSS) and terminating at the switching point of the amplifier I1 or I2. The duration of a cycle of operation (TP) is equal to the sum of the times for each half cycle:

$$TP = (tf1 + tC1) + (tf2 + tC2) \quad (1)$$

The time delays tf1 and tf2 are due primarily to the propagation times through the feedback amplifiers (I3, I4; I5, I6). When the feedback amplifiers are designed to effect a rapid turn off of the switch P1 or N2 by the use of asymmetric stages, as will be explained hereinafter, this quantity may be minimized to become a small portion of the half cycle. When this design minimization occurs, the sensitivity of the oscillator frequency to variability in the process of making I3, I4, and I5, I6, or to variability with temperature or supply voltage is reduced.

In the design of I3, I4 the time delay may be reduced by a factor of 2 to 4 at a frequency of 6 megaherz, corresponding to a delay reduction of several nanoseconds. The design increases the turn on delay of switches P1 and N2, but to no consequence—as will be explained hereinafter.

The duration of tC1 or tC2 is a function of the values of the circuits R1C1 or R2C2 which are external to the IC, the parasitic capacitances at the nodes A and C (CP1, CP2) on the IC, the voltage difference between source VDD and VSS also externally determined, and the accuracy of the threshold value of the amplifier I1 or I2 half way between VDD and VSS, which defines the end of each sloping waveform portion.

The starting voltage of the sloping portions of the waveforms are dependent solely on the difference between VDD and VSS and independent of switching device (P1 or N2) geometry, provided that P1 and N2 are made sufficiently large. When P1 and N2 turn on, they act as a low impedance clamp, and a stable voltage at the bus VDD or VSS less a small internal drop is attained well before the time required for the initiation of the sloping portion of the waveform. The internal drop is minimized by the use of a suitably large device, to make the starting voltage primarily dependent on VDD. The use of a large switch steepens the slope of the switching transient. However, the steepness is not critical so long as the slew rate due to the switch is faster than the RC circuit time constant.

The slopes of the sloping portions of the waveforms on nodes A and C, are governed by the values of resistors R1, R2 and the capacitances at nodes A and C provided by the capacity of capacitors C1, C2 and the parasitic capacitances (CP1 and CP2). The resistors R1, R2 which are a few thousand ohms, provide the only path for discharging the capacitances at the nodes A and C, since the off conductances of the switches P1 and N2 are many thousands of megohms and of no effect. In addition, the discharging rates of the capacitors are not effected by the conductivity of either switch N2 or P1 since neither are in the discharge path as the discharge takes place.

Figure 6:
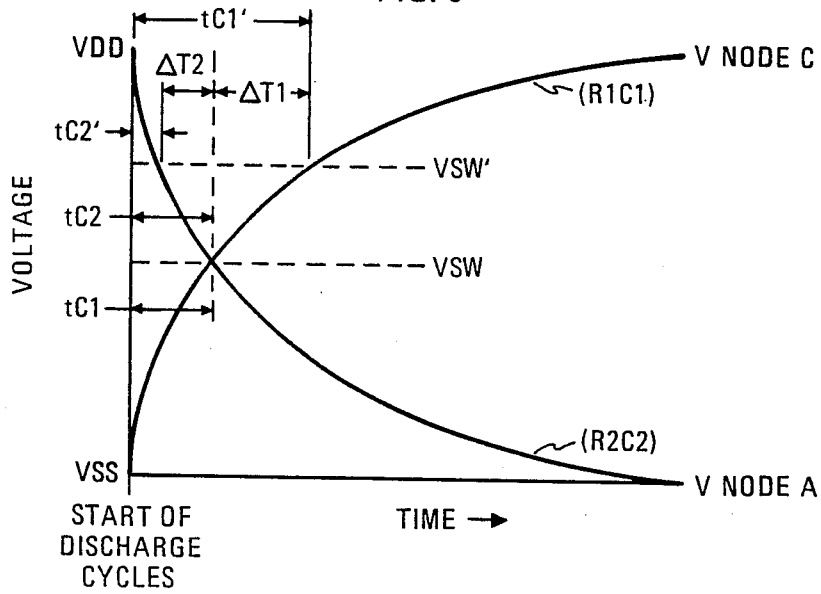
FIG. 6 is an illustration of the time dependent voltage at the nodes of the RC circuits in explanation of the frequency compensating nature of a feature of the invention.

The end points of the sloping portions of the waveforms are defined by the switching points of the amplifiers I1 and I2. Since both inverters are identical, their switching voltages will track for variations in temperature and supply voltage. Therefore the circuit will compensate for these variations by increasing one half cycle at the expense of the other, while maintaining the total period constant as illustrated in FIG. 6.

The frequency of the novel RC oscillator may be expressed by the following expression.

$$f_{Rc} = \frac{1}{\left[ +f_1 + R_1(C_1 + C_{p1})\left( \ln \frac{VOD}{VSI_1} \right) \right] + \left[ +f_2 + R_2(C_2 + C_{p2})\left( \ln \frac{VOD}{VOD - VSI_2} \right) \right]} \quad (2)$$

Figure 4:
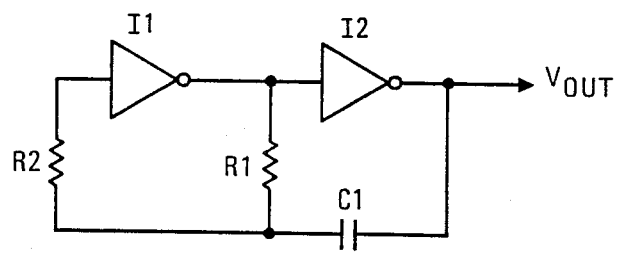
FIG. 4 is a simplified equivalent circuit representation of a prior art RC oscillator.

The present design represents a significant advance over conventional RC oscillators in establishing independence of frequency against process variables or temperature or voltage variations. In a conventional circuit, as for instance the arrangement depicted in FIG. 4, both the charging and discharging of the capacitors takes place through an active device. Thus the discharge time will be dependent upon device parameters. Analysis shows, that by eliminating this sensitivity, the error in period attributable to device variability is reduced by half.

The parameters of a design optimized for operation at 6 mhZ are as follows. The resistances R1 and R2, which are external to the IC, are approximately 3.5 Kohms. The capacitors C1 and C2 are 14 picofarads. The parasitic capacitances at the nodes A and C is approximately 1 picofarad. The off resistivity of the switches P1 and N2 is so large as to be essentially infinite. The on resistivity of the switches P1 and N2 is made small in proportion to the load resistance presented by the RC networks, being on the order of one tenth. In the embodiment, which uses 3 micron geometry, the gate widths of the switches P1 and N2 are about 200 microns.

The feedback buffer amplifiers 13, 14 and 15, 16, as earlier noted, are optimized for rapid turn off of the switches P1, N2. A slow turn on is tolerated since a delayed turn on time does not effect the oscillator timing.

The circuit of the first non-inverting feedback amplifier consisting of inverters 13 and 14, used to operate the switch N2, is shown in FIG. 3A. The amplifier 13, 14 has its input coupled to node E and its output coupled to the gate of switch N2. In the construction of this circuit, the P-FET P13 and the N-FET N14 are physically much larger than the N-FET N13 and the P-FET P14, respectively. This raises the switching voltage of inverter 13 and lowers the switching voltage of inverter 14. The net effect is to speed up the transmission of a "1" to "0" transition and slow down a "0" to "1" transition. Suitable scaling of the devices, taking into account process particulars, is indicated in FIG. 3A.

The second non-inverting buffer amplifier consisting of inverters I5, I6 used to operate the switch P1 is shown in FIG. 3B. The amplifier input is coupled to node E and the amplifier output is coupled to the gate of switch P1. In the construction of this circuit, the N-FET N15 and the P-FET P16 are physically much larger than the P-FET P15 and the N-FET N16, respectively. This lowers the switching voltage of inverter I5 and raises the switching voltage of inverter I6. The net effect is to speed up transmission of a "0" to "1" transition and slow down a "1" to "0" transition. Suitable scaling of the devices, taking into account process particulars, is indicated in FIG. 3B.

The effect of this optimization is pronounced. Assuming a frequency of 6 mhZ, the period for a cycle is 167 nanoseconds, and for a half cycle 83 nanoseconds. Assuming a natural delay through the feedback paths of 3 nanoseconds, a 25% change in that delay, corresponds to a 0.75 nanosecond change in delay. This would result in a variation of cycle time of 1.5 nanoseconds or about 0.9% change in frequency. If, however, the delay through the feedback path is designed to be faster, say 1.5 nanoseconds, then the effect of the same 25% change in delay would result in only a 0.375 nanosecond change in cycle time or about a 0.45% change in frequency. The design selected for the RC oscillator requires that the forward buffer amplifiers I1 and I2 be identical designs within the accuracy of the process (which is very good). The critical parameter, which requires matching is the switching voltages of the two amplifiers. The switching voltage, which is set midway between VSS and VDD, defines the end of the capacitor discharge cycles and is critical to oscillator timing for this reason.

The switching voltage, if it is common to both amplifiers of identical design, can vary with customary variations in temperature, power supply voltage, and process parameters without introducing a comparable error in the oscillator frequency. A variation which produces an increase in the switching voltage ($V_{SW}$) of both buffer amplifiers causes one half cycle to increase ($t_{C1}$) and the other half cycle to decrease ($t_{C2}$) in an approximately compensatory manner. The effect of the increase on the total period ($T_p$), represents the sum of the two offsetting variances, and is greatly reduced.

The compensatory action of this design may be demonstrated with reference to FIG. 6. FIG. 6 shows the exponential discharge of the two circuits R1C1 and R2C2 with the start of each discharge cycle coinciding on the time coordinate.

The waveform labeled V node C shows the discharge of capacitor C1 in the circuit R1C1. At time equals "0", the voltage on R1C1, starting at VSS, climbs steeply toward the switching voltage VSW. At the intersection, the half cycle terminates defining the time period TC1. Similarly at time equals "0", the voltage on R2C2, starting at VDD falls steeply toward VSW. When intersection occurs, the half cycle terminates, defining the time period TC2. If the inverter switching voltage is VSW, the ideal value illustrated, then $t_{C1}=t_{C2}$, and the oscillator has a 50% duty cycle.

Should the inverter switching voltage rise significantly to $V_{SW'}$, for instance, the time required for the circuit R1C1 to reach the switching intersection $t_{C1'}$ increases to $t_{C1'}$ by the amount +delta $t_1$ as shown but the time required for the circuit R2C2 to reach the switching intersection decreases to $t_{C2'}$ by the amount −delta $t_2$ as shown, in an approximately equal amount. This produces a significant change in the duty cycle. However, since the oscillator frequency depends upon the sum of $t_{C1}$ and $t_{C2}$, which experienced compensating increments (+delta $t_1$ and −delta $t_2$), the change in frequency is minor.

The size of the change in the inverter switching voltage has been exaggerated in FIG. 6 for purposes of clarity. In reality, variations in the inverter switching voltage are smaller, and the compensation very good.

Figure 2:
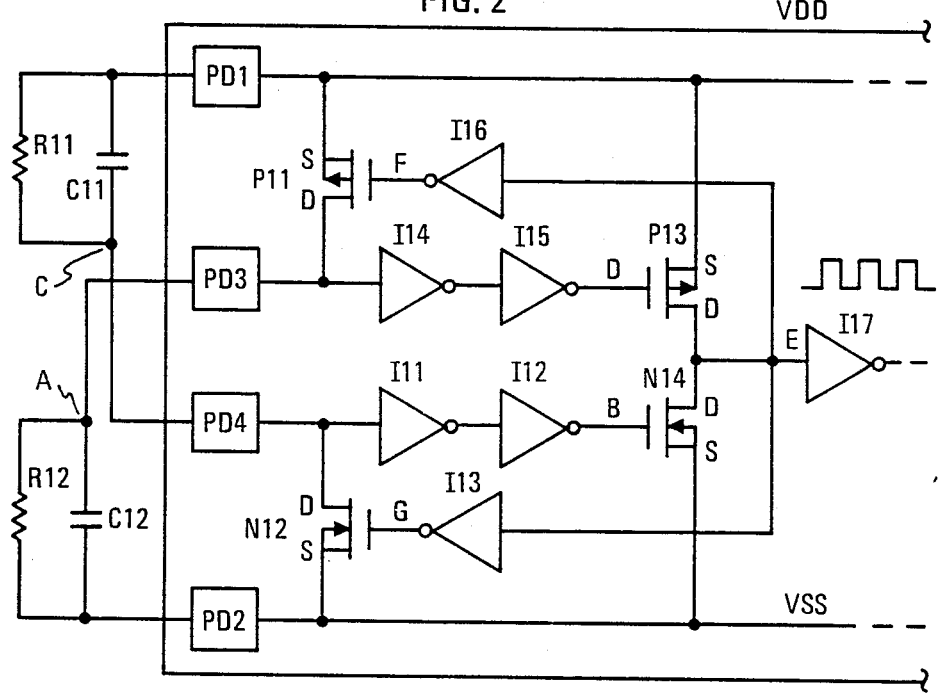
FIG. 2 is a circuit diagram of a second RC oscillator of improved frequency stability, representing a second embodiment of the invention.

In the first embodiment illustrated in FIG. 1, the forward buffer amplifiers I1 and I2 are inverting while the feedback buffer amplifiers are non-inverting. A second embodiment is illustrated in FIG. 2 in which the forward buffer amplifiers I14, I15 and I11, I12 are non-inverting and the feedback buffer amplifiers I13 and I16 are inverting. The FIG. 2 embodiment is otherwise the same as the FIG. 1 embodiment, and shares the same advantages.

The amplifiers so far described have a ±1.8% frequency variation for temperatures ranging from −55° to +125° C., with best and worst case process parameters and a 1.0 volt change in supply voltage. This accuracy meets many system requirements, and permits the design to be used with standard external components having predetermined values.

Some loss in accuracy results if either the R or the C is fabricated on the IC substrate. The resistance process being less accurate, it is normally preferable that the capacitance be provided on the chip.

The active circuitry, which has been illustrated, uses active devices designed for conventional logic applications and conventional logic stages. In "logic" applications, the active devices or stages are designed to produce a digital output—either a logical "high" state or a logical low state near the VDD or VSS voltages, respectively. To reach these output states they are conventionally driven by input signals which also correspond to logic "highs" or "low". The forward inverting buffers I1, I2 and I11, I12, which are driven by the analog voltages appearing across the RC circuits are the exception. These devices are driven at signal levels which are relatively high for analog applications, and somewhat low for certain logic applications. However with the analog input voltages slightly in excess of one-half the voltage for a logic high, the design of the amplifier is not complicated. A selection of a signal at one half the logic high has the added advantage that in the CMOS circuits herein described, both forward buffer amplifiers may have identical designs leading to equal switching voltages, and the compensatory effects on several frequency affecting parameters discussed earlier.

It is desirable that the forward buffers, which are used as threshold devices, switch precipitously from one output state to the other as the "switching voltage" is crossed. The stages should be of at least moderate gain to achieve reasonable performance. The stability of the switching level is enhanced by the gain of the buffer, the output stage, and along the feedback path. In principle, one could substitute a differential amplifier or a more highly refined thresholding circuit, for the forward buffers. The critical factor, however, for oscillator stability is that the switching voltages of the two devices be substantially equal. Gain on the order of 10 in the switching region of the buffer is adequate in the practical oscillators herein described.

What is claimed is:

1. An RC oscillator having improved frequency stability in which the active elements may be monolithically integrated, comprising:
   A. a substrate having a plurality of terminals at the perimeter thereof, including,
      (i) a first terminal (Pd1) for connection to a source of drain potentials (VDD),
      (ii) a second terminal (Pd2) for connection to a source of source potentials (VSS), and
   B. a first two terminal resistance capacitance shunt circuit (R1C1) consisting of a first resistor R1 and a first capacitor C1 and having one terminal coupled to said first substrate terminal and the other terminal to a first node (C);
   C. a second two terminal resistance capacitance shunt circuit (R2C2) consisting of a second resistor R2 and a second capacitor C2 and having one terminal coupled to said second substrate terminal and the other terminal coupled to a second node (A);
   D. a first P type field effect transistor switch (P1) having a source, a drain, and a gate electrode, the source electrode thereof being coupled to said first substrate terminal, the drain electrode thereof being coupled to said node A for periodically connecting said second circuit (R2C2) between said sources of source and drain potentials;
   E. a first N type field effect transistor switch (N2) having a source, a drain, and a gate electrode, the source electrode thereof being coupled to said second substrate terminal (VSS), the drain electrode thereof being coupled to said first node C for periodically connecting said first circuit (R1C1) between said sources of source and drain potentials;
   F. a pair of buffer amplifiers each designed to switch to a logical high or a logical low output state when the input voltage crosses a switching voltage, the first buffer amplifier having its input coupled to said first node (C) and the second buffer amplifier having its input coupled to said second node (A);
   G means responsive to the outputs of said first and second amplifiers to cause one switch (P1 or N2) to be on during the period that the other switch is off, to charge the capacitors of said RC circuits alternately via said switches,
   said means effecting the turn off of one switch (P1), as the voltage on said first RC circuit (R1C1) crosses the switching voltage of said first amplifier as a result of said first capacitor (C1) discharging through said first resistor (R1), and initiating the discharge of said second capacitor (C2) through said second resistor (R2), which upon crossing the switching voltage of said second amplifier, turns off the other switch (N2) and initiates the discharge of said first capacitor (C1) through said first resistor (R1), and a repeat of the sequence,
   the oscillator frequency being primarily determined by the sum of the durations of said two resistor controlled capacitor discharges, each of which take place while the associated transistor switch is off.

2. The combination set forth in claim 1 wherein the switches (P1 and N2) are made relatively large to cause the potential of said capacitors (C1 or C2) when charged, to reach a potential differing from the difference between source and drain potentials by a small value to make the frequency substantially independent of device processing or temperature.

3. The combination set forth in claim 2 wherein said two buffer amplifiers are of like design with a switching voltage at approximately one half the difference between source and drain potentials, the effect of any processing error or temperature variation upon the switching voltage elevating or depressing both switching voltages together, and causing offsetting changes in period.

4. The combination set forth in claim 3 wherein said means (G) further comprises an output stage coupled to the output of said buffer amplifiers (P3, N4), and a pair of feedback amplifiers, each coupled between the output of said output stage and the input of one transistor switch.

5. The combination set forth in claim 4 wherein said feedback amplifiers are optimized for rapid turn off of said transistor switches to reduce the effect of process variation or temperature on frequency.

6. An RC oscillator having improved frequency stability, in which the active elements may be monolithically integrated using a CMOS field effect transistor process, comprising:
   A. a substrate having a plurality of terminals at the perimeter thereof, including,
      (i) a first terminal (Pd1) for connection to a source of drain potentials (VDD),
      (ii) a second terminal (Pd2) for connection to a source of source potentials (VSS), and
   B. a first two terminal resistance capacitance shunt circuit (R1C1) consisting of a first resistor R1 and a first capacitor C1 and having one terminal coupled to said drain potential (VDD) and the other terminal to a first node (C);
   C. a second two terminal resistance capacitance shunt circuit (R2C2) consisting of a second resistor R2 and a second capacitor C2 and having one terminal coupled to said source potential (VSS) and the other terminal coupled to a second node (A);

D. a first P type field effect transistor switch (P1) having a source, a drain, and a gate electrode, the source electrode thereof being coupled to said first substrate terminal, the drain electrode thereof being coupled to said node A for periodically connecting said second circuit (R2C2) between said sources of source and drain potentials;

E. a first N type field effect transistor switch (N2) having a source, a drain, and a gate electrode, the source electrode thereof being coupled to said second substrate terminal (VSS), the drain electrode thereof being coupled to said first node C for periodically connecting said first circuit (R1C1) between said sources of source and drain potentials F. a pair of forward buffer amplifiers each designed to switch to a logical high or a logical low output state when the input voltage crosses a switching voltage, the first buffer amplifier having its input coupled to said first node (C) and the second buffer amplifier having its input coupled to said second node (A);

G. an output stage, including,
  (i) a second P type field effect transistor (P3) having a source, a drain, and a gate electrode, the source electrode thereof being coupled to said first substrate terminal (VDD), the gate electrode thereof being coupled to the output of one of said forward buffer amplifiers, and
  (ii) a second N type field effect transistor (N4) having a source, a drain, and a gate electrode, the source electrode thereof being coupled to said second substrate terminal (VSS), the gate electrode thereof being coupled to the output of the other of said second forward buffer amplifiers, the drain electrodes of said second P type transistor (P3) and said second N type transistor (N4) being connected together to form the output terminal (E) of said RC oscillator;

H. a pair of feedback buffer amplifiers, one (I5, I6) coupled between said oscillator output terminal (E) and the gate of said first resistor switch (P1), and the second (I3, I4) coupled between said oscillator output terminal (E), and the gate of said second transistor switch (N2), one buffer amplifier pair being inverting and the other pair non-inverting with the forward amplifier pair being connected to effect alternate conduction of said transistor switches (P1 and N2) by turning off one switch (P1), as the voltage on said first RC circuit (R1C1) crosses the switching voltage of said first amplifier as a result of said first capacitor (C1) discharging through said first resistor (R1), and initiating the discharge of said second capacitor (C2) through said second resistor (R2), which upon crossing the switching voltage of said second amplifier, turns off the other switch (N2) and initiates the discharge of said first capacitor (C1) through said first resistor (R1), and a repeat of the sequence, the oscillator frequency being primarily determined by the sum of the durations of said two resistor controlled capacitor discharges, each of which take place while the associated transistor switch is off.

7. The RC oscillator set forth in claim 6 wherein two terminals (Pd3 and Pd4) are provided on said substrate for connection to said first and second nodes (C and D), respectively, and wherein said active elements D, E, F, G and H are fabricated on said substrate, and said first and second circuits (B) and (C) are external to said substrate.

8. The RC oscillator set forth in claim 7 wherein the N type and P type transistors of said feedback buffer amplifier have unequal areas, proportioned to effect said rapid turn off of said transistor switches.

9. The RC oscillator set forth in claim 6 wherein said first buffer amplifier pair (I1, I2) is inverting, the output of said first buffer amplifier (I1) being coupled to the gate of said P type transistor (P3) of said output stage, and the output of said second buffer amplifier (I2) being coupled to the gate of said N type transistor (N4) of said output stage, and said second buffer amplifier pair (I3, I4; I5, I6) is non-inverting.

10. The RC oscillator set forth in claim 9 wherein the first stage (I3) of said first feedback buffer amplifier (I3, I4) has a large area p device and a small area N device, and the second stage (I4) has a small area P device and a large area N device to effect rapid turn off of said second transistor switch (N2), and the first stage (I5) of said second feedback buffer amplifier (I5, I6) has a small area P type device and a large area N type device, and the second stage (I6) has a large area P type device and a small area N type device to effect rapid turn off of said first transistor switch (P1).

11. The RC oscillator set forth in claim 10 wherein two terminals (Pd3 and PD4) are provided on said substrate for connection to said first and second nodes (C and D), respectively, and wherein said active elements D, E, F, G and H are fabricated on said substrate, and said first and second circuits (B) and (C) are external to said substrate.

12. The RC oscillator set forth in claim 6 wherein said first buffer amplifier pair (I14, I15; Il1, I12) is non-inverting, the output of said first buffer amplifier (Il1, I12) being coupled to the gate of said N type transistor (N14) of said output stage, and the output of said second buffer amplifier (I14, I15) being coupled to the gate of said P type transistor (P13) of said output stage, and said second buffer amplifier pair (I16; I13) is inverting.

13. The RC oscillator set forth in claim 12 wherein said first feedback buffer amplifier (I3) has a small area P device and a large area N device to effect rapid turn off of said second transistor switch (N2), and said second feedback buffer amplifier (I6) has a large area P type device and a small area N type device to effect rapid turn off of said first transistor switch (P1).

14. The RC oscillator set forth in claim 13 wherein two terminals (Pd3 and PD4) are provided on said substrate for connection to said first and second nodes (C and D), respectively, and wherein said active elements D, E, F, G and H are fabricated on said substrate, and said first and second circuits (B) and (C) are external to said substrate.

* * * * *